(12) United States Patent
Tanaka et al.

(10) Patent No.: US 9,437,508 B2
(45) Date of Patent: Sep. 6, 2016

(54) METHOD FOR MANUFACTURING SEMICONDUCTOR DEVICE AND SEMICONDUCTOR DEVICE

(71) Applicant: Panasonic Corporation, Kadoma-shi, Osaka (JP)

(72) Inventors: Zyunya Tanaka, Osaka (JP); Masanori Minamio, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/381,133

(22) PCT Filed: Mar. 6, 2013

(86) PCT No.: PCT/JP2013/001373
§ 371 (c)(1),
(2) Date: Aug. 26, 2014

(87) PCT Pub. No.: WO2013/171946
PCT Pub. Date: Nov. 21, 2013

(65) Prior Publication Data
US 2015/0035132 A1 Feb. 5, 2015

(30) Foreign Application Priority Data

May 15, 2012 (JP) .................................. 2012-111075

(51) Int. Cl.
*H01L 23/48* (2006.01)
*H01L 23/04* (2006.01)
(Continued)

(52) U.S. Cl.
CPC ............. *H01L 23/041* (2013.01); *H01L 21/52* (2013.01); *H01L 23/4334* (2013.01);
(Continued)

(58) Field of Classification Search
CPC . H01L 23/24; H01L 23/041; H01L 23/4334; H01L 23/49575

USPC .......................................................... 257/692
See application file for complete search history.

(56) References Cited

U.S. PATENT DOCUMENTS

| | | | |
|---|---|---|---|
| 6,421,244 B1 * | 7/2002 | Shinohara | ............... H01L 23/24 257/E23.14 |
| 6,867,484 B2 | 3/2005 | Nakajima et al. | |
| 2005/0161785 A1 | 7/2005 | Kawashima | |

FOREIGN PATENT DOCUMENTS

| | | |
|---|---|---|
| JP | 54-107257 | 8/1979 |
| JP | 6-204400 | 7/1994 |

(Continued)

OTHER PUBLICATIONS

Extended European Search Report, Aug. 11, 2015; European Patent Application No. 13791481.8 (7 pages).

*Primary Examiner* — Douglas Menz
(74) *Attorney, Agent, or Firm* — Hamre, Schumann, Mueller & Larson, P.C.

(57) ABSTRACT

In a method for manufacturing a semiconductor device according to the present invention, as shown in FIG. 2(A), a case (2) including a first terminal (1) is placed on a working table (3) with an opening (30) formed at the bottom of the case (2). Subsequently, as shown in FIG. 2(B), a plurality of packages (6,6,6) including second terminals (4) are placed on the working table (3) through the opening (30) of the case (2), forming a clearance (31) between the first terminal (1) and the second terminal (4). As shown in FIG. 2(C), a bonding material (7) is disposed in the clearance (31) so as to electrically connect the first terminal (1) and the second terminal (4). Thus, the exposed surfaces of the packages (6,6,6) in the opening (30) of the case (2) are aligned at the same height, thereby reducing variations in thermal resistance among the packages (6,6,6).

5 Claims, 7 Drawing Sheets

(51) Int. Cl.
  *H01L 23/433*  (2006.01)
  *H01L 23/495*  (2006.01)
  *H01L 25/11*   (2006.01)
  *H01L 21/52*   (2006.01)
  H01L 23/31   (2006.01)
  H01L 23/00   (2006.01)
  H01L 21/60   (2006.01)

(52) U.S. Cl.
  CPC .. *H01L 23/49555* (2013.01); *H01L 23/49562* (2013.01); *H01L 23/49575* (2013.01); *H01L 24/09* (2013.01); *H01L 25/115* (2013.01); H01L 23/3107 (2013.01); H01L 24/06 (2013.01); H01L 24/29 (2013.01); H01L 24/32 (2013.01); H01L 24/45 (2013.01); H01L 24/48 (2013.01); H01L 24/49 (2013.01); H01L 24/73 (2013.01); H01L 2021/60015 (2013.01); H01L 2224/04042 (2013.01); H01L 2224/0603 (2013.01); H01L 2224/29111 (2013.01); H01L 2224/32245 (2013.01); H01L 2224/45014 (2013.01); H01L 2224/45015 (2013.01); H01L 2224/45124 (2013.01); H01L 2224/48091 (2013.01); H01L 2224/48137 (2013.01); H01L 2224/48139 (2013.01); H01L 2224/48247 (2013.01); H01L 2224/49175 (2013.01); H01L 2224/73265 (2013.01); H01L 2224/80801 (2013.01); H01L 2924/0105 (2013.01); H01L 2924/01029 (2013.01); H01L 2924/12042 (2013.01); H01L 2924/1305 (2013.01); H01L 2924/13055 (2013.01); H01L 2924/13091 (2013.01); H01L 2924/15787 (2013.01); H01L 2924/181 (2013.01); H01L 2924/30107 (2013.01)

(56) References Cited

FOREIGN PATENT DOCUMENTS

| JP | 10-84079    | 3/1998  |
|----|-------------|---------|
| JP | 2002-76258  | 3/2002  |
| JP | 2008-282919 | 11/2008 |
| JP | 4177571 B   | 11/2008 |
| JP | 2009-99339  | 5/2009  |
| JP | 2011-103367 | 5/2011  |
| JP | 2012-4346   | 1/2012  |

* cited by examiner

F I G. 5
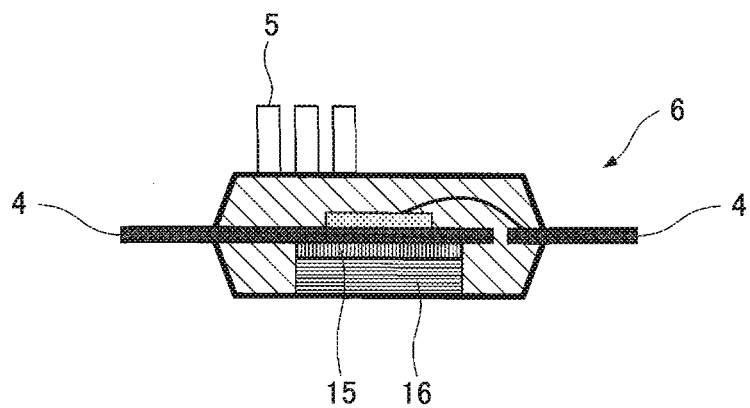
F I G. 6
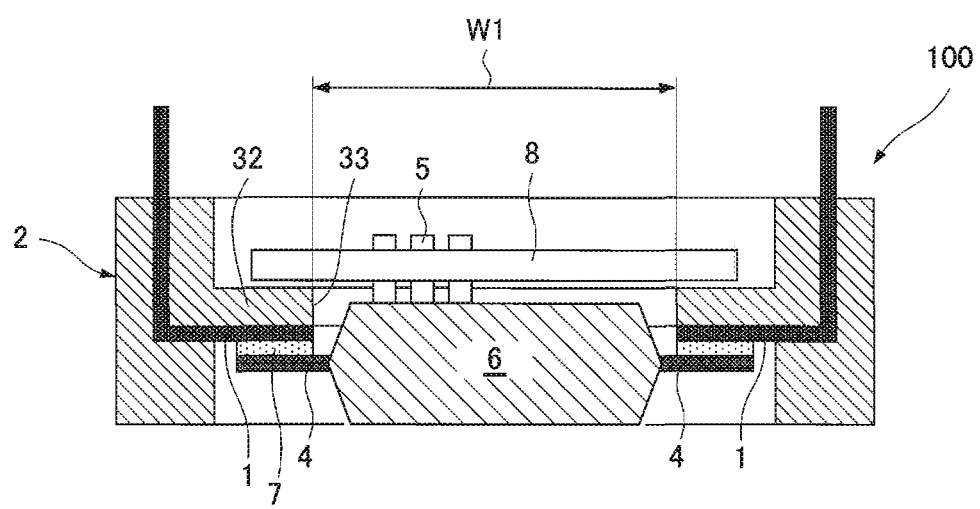

METHOD FOR MANUFACTURING SEMICONDUCTOR DEVICE AND SEMICONDUCTOR DEVICE

TECHNICAL FIELD

The present invention relates to a semiconductor device that includes power devices such as a switching element and is used for power conversion of inverters and so on.

BACKGROUND ART

As power conditioners of photovoltaic power generation systems and power devices used for motor revolution control, more products have been designed in modules, e.g., a package of multiple power devices, in order to reduce a footprint, improve performance with a shorter distance between semiconductor elements, and reduce a design load for users.

Packaged products are called power modules. Such power modules contain IGBTs (insulated gate bipolar transistors) for switching and power semiconductor elements such as MOSFETs (Metal-Oxide-Semiconductor Field Effect Transistors). Modules particularly called IPMs (Intelligent Power Modules) contain multiple driver elements for driving power semiconductor elements and further contain multiple passive elements if necessary with the function of driving and protecting power semiconductors. Such modules have expanded a new market.

The structure of such a power module is typically manufactured as follows: a power semiconductor element bonded on a ceramic substrate is mounted on a resin-molded frame called an insert case, the terminals of the case and the surface of the power semiconductor element are connected with metallic wires such as Al wires, and then the terminals and the power semiconductor element are potted with silicone gel so as to be collectively molded.

However, a heat sink attached to the back side of the insert case may be warped depending upon the module size or structure, making it difficult to obtain flatness on the back side. In this case, the power module attached to the heat sink via heat sink grease may vary in the thickness of the heat sink grease depending upon the location. A portion having a large thickness considerably decreases in heat dissipation efficiency and thus may cause thermal destruction in the power module.

A solution to this problem is disclosed in Patent Literature 1.

FIGS. 10(A) and 10(B) are plan views of a semiconductor device 100 described in Patent Literature 1. FIG. 10(B) is a cross-sectional view of FIG. 10(A).

The semiconductor device 100 includes a case 101 and at least two packages 102. The case 101 is composed of a resin-molded frame including external terminals 103 and output terminals 104. Tapped holes 105 for connection to a heat sink (not shown) are provided on the four corners of the case 101. The package 102 includes, for example, a metal block 106 made of Cu. An insulating substrate 114 made of materials such as ceramic is fixed on the back side of the metal block 106. On the metal block 106, a power semiconductor element 108 is fixed via a metallic lead frame 107. The power semiconductor element 108 is, for example, a MOSFET or an IGBT. The surface electrodes of the power semiconductor element 108 are connected to inner leads 110 via bonding wires 109 made of materials such as Al with a diameter of about 300 μm.

The metal block 106 and the power semiconductor element 108 are molded with mold resin 111, e.g., epoxy resin so as to partially expose the lead frame 107.

From the mold resin 111, power terminals 112 and control terminals 113 are drawn and exposed. The power terminals 112 are connected to the external terminals 103 and the output terminals 104 of the case 101. The control terminals 113 are drawn from a different side from the power terminals 112 drawn from the mold resin 111.

A method for manufacturing the semiconductor device will be briefly described below.

First, the lead frame 107 is fixed on the metal block 106 and then the power semiconductor element 108 is mounted thereon. After that, the metal block 106, the lead frame 107, and the power semiconductor element 108 are resin-molded using a transfer molding apparatus. Specifically, the lead frame 107 with the fixed metal block 106 and so on is disposed in molds, and then epoxy resin is poured into the molds to form the mold resin 111.

In this case, the back side of the metal block 106 is exposed from the mold. After the mold resin 111 is formed, the metal block 106 is removed from the molds, and then the insulating substrate 114 is joined to the back side of the metal block 106 with solder or the like.

Finally, an unnecessary part of the lead frame 107 is removed, and then the lead frame 107 is processed into a desired shape to form the power terminals 112 and the control terminals 113. Thus, the assembly of the package 102 is completed.

Subsequently, as shown in FIGS. 10(A) and 10(B), the packages 102 are placed into the case 101, and then the external terminals 103 and the output terminals 104 are connected to the power terminals 112. For example, solder or the like is used for the connection. The power terminals 112 are connected to the external terminals 103 and the output terminals 104 so as to fix the packages 102 in the case 101.

CITATION LIST

Patent Literature

[Patent Literature 1] Japanese Patent No. 4177571

SUMMARY OF INVENTION

Technical Problem

The conventional semiconductor device is disadvantageous from the following points of view:

During the actual use of the semiconductor device 100, a control board for controlling the power semiconductor element 108 is mounted on the control terminal 113 provided on the package 102, which is not described in the citation list. The control board, as has been discussed, drives and protects the power semiconductor element 108, and a shorter wiring distance is electrically advantageous to, for example, a reduction in inductance. Hence, control boards contained in power modules have become the main current.

In this case, after the packages 102 are assembled into the case 101, the control boards are mounted on the control terminals 113 of the packages 102. The semiconductor device 100 is then fixed by screwing from the tapped holes 105 to the heat sink. In the citation list, variations in the height of the packages 102 are not considered. Thus, if the packages 102 have different bottom heights when the semiconductor device 100 is screwed to the heat sink, different reaction forces are applied to the packages 102 bonded to the heat sink.

In the related art, heat sink grease is applied to the back sides of the packages 102. For example, if the back side of the package 102 protrudes from the back side of the case 101, a relatively large lifting force is generated when the semiconductor device 100 is mounted. If the back side of the package 102 is recessed from the back side of the case 101, a clearance is formed between the heat sink and the package 102, thereby reducing a reaction force even through the heat sink grease. In this case, the control board mounted with solder has a fixed height and thus an excessive stress is generated on the junction of the control terminal 113 of the package 102 that protrudes from the back side of the case 101. This may break the solder so as to cause faulty electrical continuity.

In other words, if the packages 102 vary in height relative to the case 101, a largest reaction force is applied to the package 102 most protruding on the mounting surface to the heat sink from the bottom of the case 101. Furthermore, a displacement of the package 102 is maximized when the semiconductor device 100 is mounted, generating a largest stress to the junction of the control terminal 113.

Furthermore, the conventional semiconductor device is disadvantageous as follows:

As has been discussed, when the semiconductor device 100 is fixed to the heat sink, the heat sink grease is applied to the bottoms of the packages to improve the contact. The heat sink grease is applied beforehand with a large thickness and then a desired thickness is achieved by a pressing force for screwing and torque management. As has been discussed, variations in the height of the packages 102 may however change a stress applied to the package 102. This may vary the thickness of the heat sink grease on the bottoms of the packages 102, seriously affecting heat dissipation. For example, heat sink grease has a thermal conductivity of 1 W/m·° C. or less and heat sink grease with a thickness of 100 μm or less is used. If height variations increase the thickness of the heat sink grease of the package 102 to 200 μm, thermal resistance from the power semiconductor element 108 to the heat sink may be at least doubled. The power semiconductor element 108 at a rated temperature may be thermally broken so as to cause a malfunction.

In recent years, power semiconductor elements made of new materials such as SiC (Silicon Carbide) and GaN (Gallium Nitride) have been put to practical use instead of conventional power semiconductor elements made of Si (Silicon). These new devices can operate at temperatures exceeding 200° C., which are higher than a conventional operating temperature of 150° C. Thus, a size reduction is expected with a simplified heat sink mechanism. In other words, the heat sink having a smaller size than a conventional heat sink can contribute to a size reduction of the overall set.

However, as the heat sink decreases in size, the ratio of heat sink grease relative to thermal resistance increases in the overall structure containing the semiconductor device 100. This also increases the influence of variations in height. In the future, the thickness management of heat sink grease is expected to become more important.

The present invention has been devised in view of these problems. An object of the present invention is to provide a method for manufacturing a semiconductor device and the semiconductor device, which can reduce variations in thermal resistance among packages mounted in a case and suppress an excessive stress to a junction between a control board and a control terminal.

Solution to Problem

According to the present invention, a method for manufacturing a semiconductor device including a plurality of packages disposed in a resin-molded case, the package containing a power semiconductor element, the method including: placing the case on a working table with an opening formed at the bottom of the case, the case including a first terminal with one end internally drawn along the bottom of the case and connected to the power semiconductor element; placing the package on the working table through the opening of the case, the package including a second terminal connected to the power semiconductor element, and forming a clearance between the first terminal of the case and the second terminal of the package; and electrically connecting the first terminal and the second terminal with a bonding material disposed in the clearance.

According to the present invention, a method for manufacturing a semiconductor device including a plurality of packages disposed in a resin-molded case, the package containing a power semiconductor element, the method including: placing the package on a working table, the package including a second terminal connected to the power semiconductor element, the second terminal being extended along the working able; and placing the case on the working table so as to cover the packages with an opening formed at the bottom of the case, the case including a first terminal with one end internally drawn along an intermediate position in the depth direction of the case and connected to the power semiconductor element, and electrically connecting the first terminal and the second terminal with a bonding material between the first terminal of the case and the second terminal of the package.

According to the present invention, a method for manufacturing a semiconductor device including a plurality of packages disposed in a resin-molded case, the package containing a power semiconductor element, the method including: placing the case on a working table with an opening formed at the bottom of the case, the case including a first terminal with one end internally drawn in the depth direction of the case and connected to the power semiconductor element; and placing the packages on the working table through the opening of the case, the package including a second terminal connected to the power semiconductor element and drawn in the depth direction of the case, the package being placed such that the first terminal of the case and the second terminal of the package are in contact with each other and are electrically connected to each other.

A semiconductor device according to the present invention includes a plurality of packages disposed in a resin-molded case, the package containing a power semiconductor element, the semiconductor device including: the packages each including a second terminal connected to the power semiconductor element contained in the package; the case including an opening formed at the bottom of the case so as to expose a part of the package, the case including a first terminal with one end internally drawn along the bottom of the case and connected to the second terminal; and a bonding material disposed in a clearance along the bottom of the case between the first terminal of the case and the second terminal of the package so as to electrically connect the first terminal and the second terminal of the package.

A semiconductor device according to the present invention includes a plurality of packages disposed in a resin-molded case, the package containing a power semiconductor element, the semiconductor device including: the packages each including a second terminal connected to the power semiconductor element contained in the package; the case including an opening formed at the bottom of the case so as to expose a part of the package, the case including a first terminal with one end internally drawn along an intermediate position in the depth direction of the case and connected to the second terminal; and a bonding material disposed in a clearance along the bottom of the case between the first terminal of the case and the second terminal of the package so as to electrically connect the first terminal and the second terminal of the package.

A semiconductor device according to the present invention includes a plurality of packages disposed in a resin-molded case, the package containing a power semiconductor element, the semiconductor device including: the packages each including a second terminal connected to the power semiconductor element contained in the package; and the case including an opening formed at the bottom of the case so as to expose a part of the package, the case including a first terminal with one end internally drawn in the depth direction of the case and connected to the power semiconductor element, wherein the second terminal of the package is extended in the depth direction along the first terminal of the case and is in contact with the first terminal, and the first terminal and the second terminal are electrically connected to each other by one of a caulked joint and ultrasonic bonding.

Advantageous Effects of Invention

According to the present invention, a clearance is formed between a first terminal of a case placed on a working table and a second terminal of a package placed on the working table, and the first terminal and the second terminal are electrically connected to each other via a bonding material in the clearance formed in parallel with the working table. This can align the bottoms of packages mounted in the case at the same height, reducing variations in thermal resistance among the packages. Moreover, an excessive stress applied to a control board mounting part can be suppressed.

According to the present invention, the case and the package are placed on the working table such that the first terminal drawn from the case in the depth direction and the second terminal drawn from the package in the depth direction are in contact with each other. The first terminal and the second terminal in contact with each other are caulked or electrically connected to each other by a caulked joint or ultrasonic bonding. This can align the bottoms of the packages mounted in the case at the same height, reducing variations in thermal resistance among the packages. Moreover, an excessive stress applied to the control board mounting part can be suppressed.

BRIEF DESCRIPTION OF DRAWINGS

FIG. 5 is a cross-sectional view showing the package according to the first embodiment.

FIG. 6 is a cross-sectional view showing a semiconductor device according to a second embodiment of the present invention.

DESCRIPTION OF EMBODIMENTS

A method for manufacturing a semiconductor device according to the present invention will be described below in accordance with the following embodiments.

(First Embodiment)

Figure 1:
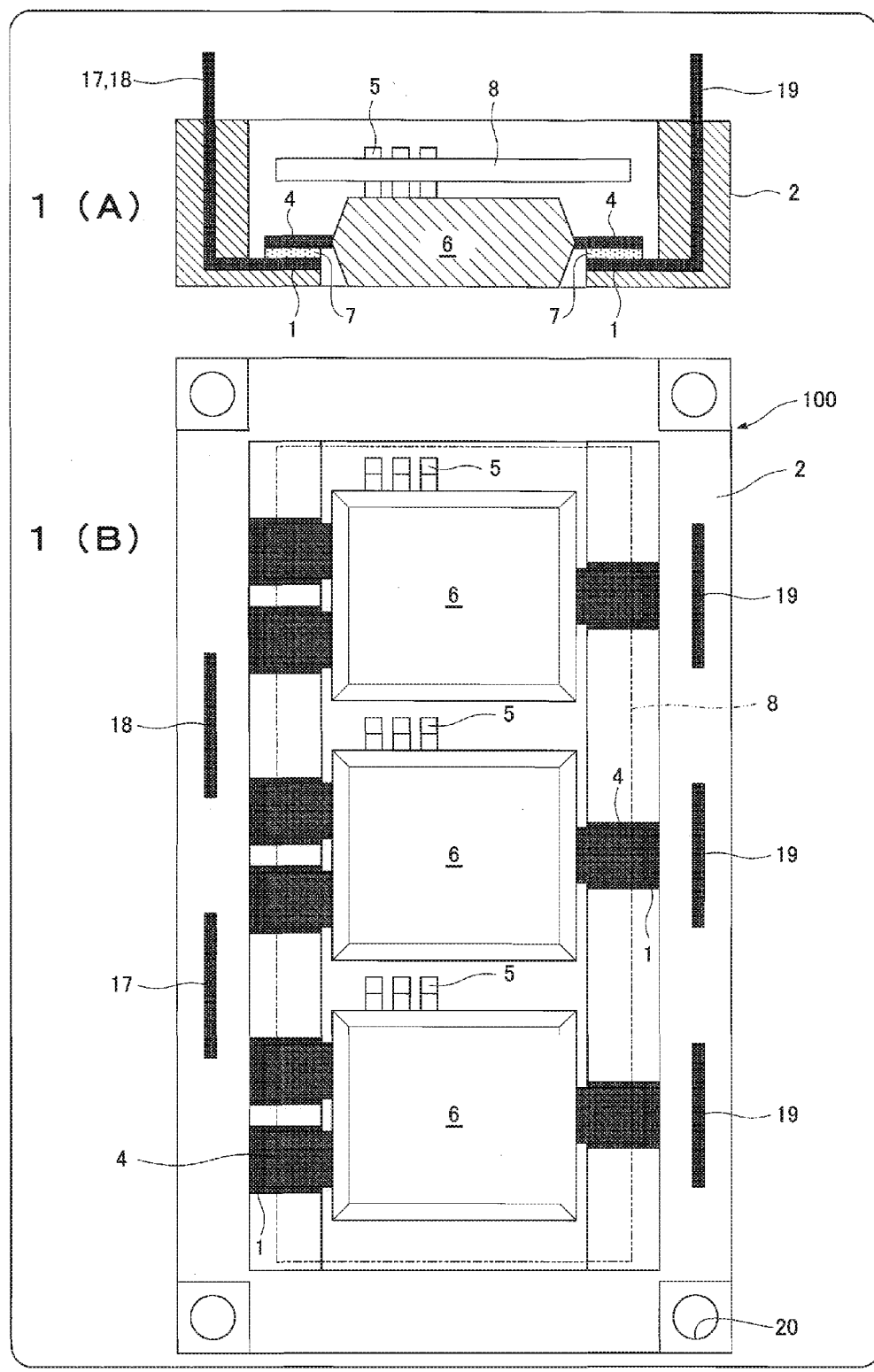
FIG. 1(A) shows a cross-sectional view of a semiconductor device according to a first embodiment of the present invention.
FIG. 1(B) shows a plan view of the semiconductor device according to the first embodiment of the present invention.

FIGS. 1(A) and 1(B) are a cross-sectional view and a plan view showing a semiconductor device 100 according to a first embodiment.

A case 2 formed as a frame contains a plurality of packages 6. The case 2 is a resin-molded frame including a positive terminal 17, a negative terminal 18, and output terminals 19.

In order to connect second terminals 4, which correspond to the positive and negative electrodes of the packages 6, to the positive terminal 17 and the negative terminal 18 of the case 2, the positive terminal 17 and the negative terminal 18 are split in the case 2, which is not illustrated in FIGS. 1(A) and 1(B).

In other words, the terminals beforehand worked into metal sheets with desired shapes are molded with resin at the same time, forming a structure with the embedded terminals.

The package 6 has third terminals 5 that are bent upward from the bottom of the case 2 in the depth direction, in addition to the second terminals 4 extended along the bottom of the case 2.

Tapped holes 20 for connection to a heat sink are provided on the four corners of the case 2. In the present embodiment, the case 2 contains the three packages 6. The present invention is applicable to a semiconductor device including at least two packages 6. Moreover, the positional relationship among the positive terminal 17, the negative terminal 18, and the output terminals 19 is not limited to that of the present embodiment.

FIGS. 2(A) to 2(D) show the manufacturing process of the semiconductor device according to the first embodiment of the present invention.

Figure 2:
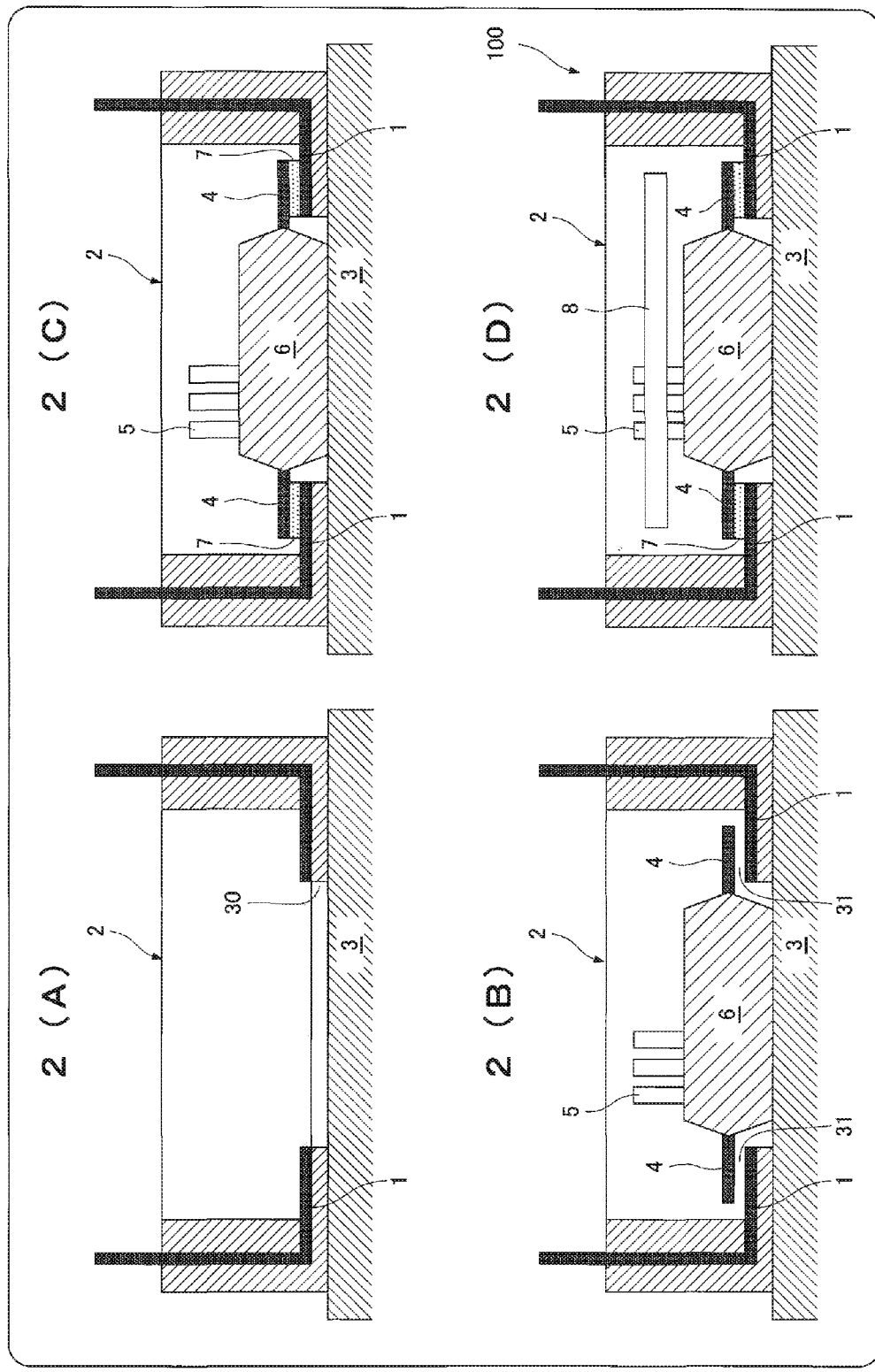
FIG. 2(A) shows a manufacturing process drawing of the semiconductor device according to the first embodiment.
FIG. 2(B) shows a manufacturing process drawing of the semiconductor device according to the first embodiment.
FIG. 2(C) shows a manufacturing process drawing of the semiconductor device according to the first embodiment.
FIG. 2(D) shows a manufacturing process drawing of the semiconductor device according to the first embodiment.

First, as shown in FIG. 2(A), the case 2 is placed on a working table 3 having a flat surface. The case 2 is a rectangular frame having an opening 30 at the bottom of the case 2. The case 2 includes first terminals 1, each having one end exposed at the bottom of the case 2 and the other end drawn out of the case 2. The first terminal 1 can be composed of Cu or an alloy containing Cu as a principal material. The surface of the first terminal 1 may be plated with a metal. Since a large current is used in the field of power modules, a desirable material contains a high ratio of Cu with small electrical resistance and high thermal conduction. The case 2 can undergo insert molding using resin together with the first terminals 1. In this case, the resin is desirably, for example, PPS (Poly Phenylene Sulfide, Resin) because of its high heat resistance and stiffness.

The working table 3 can be, for example, a machined metallic stage. Moreover, the working table 3 desirably includes a positioning mechanism, which is not shown, for the case 2 to improve workability.

At this point, the bottom of the case 2 and the working table 3 are substantially in parallel with each other. A clearance between the case 2 and the working table 3 is desirably adjusted to 50 µm or less to suppress the occurrence of cracks on the resin which is a material of the case 2 fixed by screwing.

Figure 10:
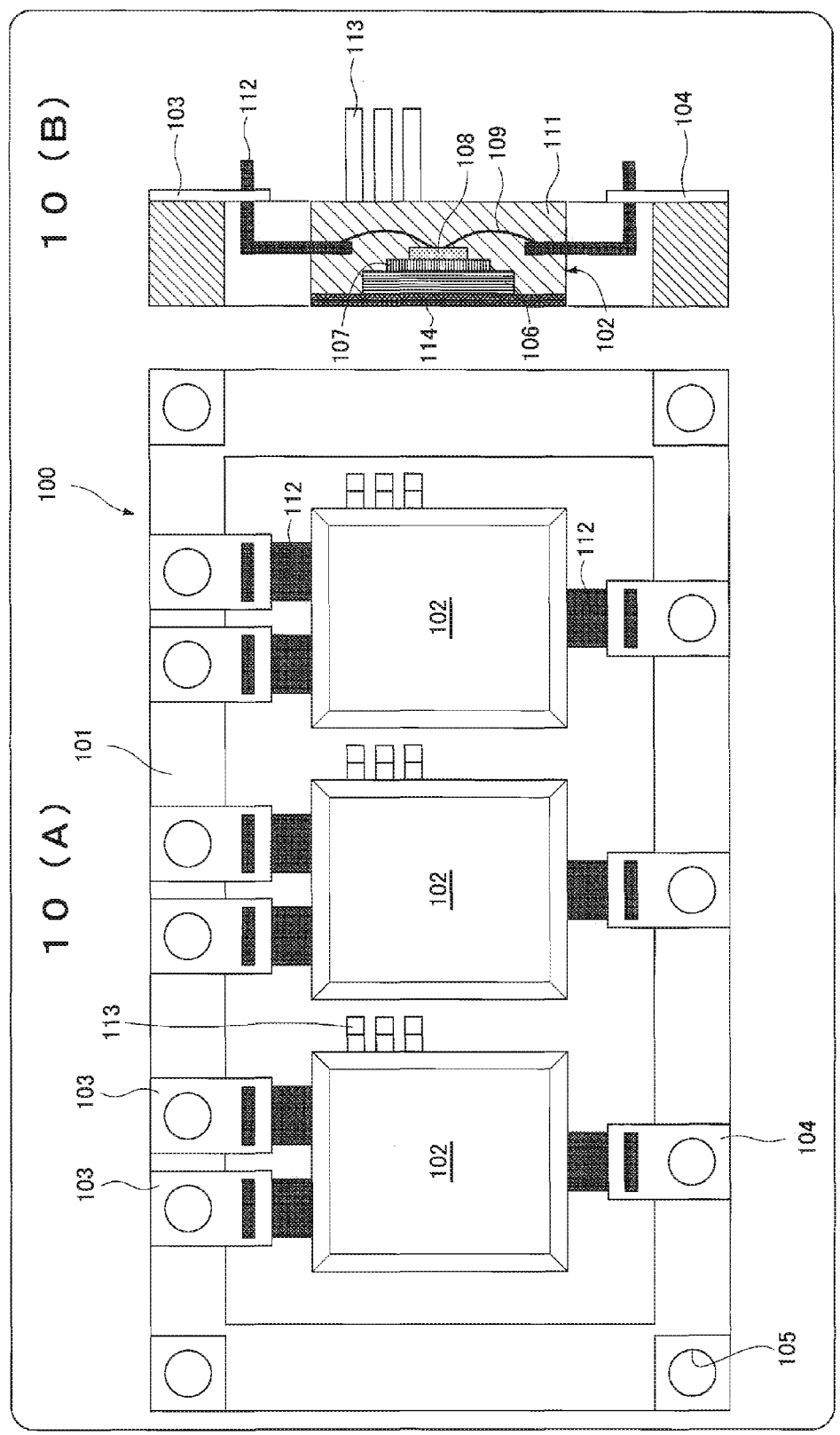
FIG. 10(A) shows a schematic diagram of a semiconductor device according to a conventional embodiment.
FIG. 10(B) shows a schematic diagram of the semiconductor device according to the conventional embodiment.

Subsequently, as shown in FIG. 2(B), the packages 6 are placed on the working table 3 exposed in the case 2. Furthermore, specifically as in FIG. 10(A), the case 2 is so large as to accommodate the multiple packages 6, in this case, the three packages 6.

At this point, the bottoms of the three packages 6 set in the case 2 and the working table 3 are substantially in parallel with each other. A gap of 50 µm or less between the packages 6 and the working table 3 is not disadvantageous because the flatness of the heat sink, to which power modules are attached, is managed at about 50 µm. The clearance from the bottoms of the packages 6 can be reproduced in practical use by adjusting the flatness of the working table 3 to the flatness of the heat sink.

The second terminals 4 and the third terminals 5 can be composed of Cu or an alloy containing Cu as a principal component. The surfaces of the second and third terminals may be plated with a metal. Since the third terminals 5 are mounted on a control board in a downstream process, the package 6 is desirably plated with a Sn alloy, for example, Sn—Bi plating is desirable in view of solder wettability. Moreover, plating with a thickness of at least 5 µm is not disadvantageous.

In the state of FIG. 2(B), the bottoms of the case 2 and the packages 6 are in contact with the working table 3. In this state, a clearance 31 is generated between the first terminal 1 of the case 2 and the second terminal 4 of the package 6. A distance between the Laying surface of the first terminal 1 and the Laying surface of the second terminal 4 allows the bottom of the package 6 to be always in contact with the working table 3. With this configuration, the bottom of the case 2 and the bottoms of the packages 6 can be precisely aligned with one another.

Subsequently, in the step of FIG. 2(C), the first terminals 1 and the second terminals 4 are electrically connected to each other with a bonding material 7. The bonding material 7 may be, for example, solder or Ag paste. As illustrated in FIG. 2(B), the clearance 31 is generated between the first terminal 1 and the second terminal 4 and thus the bonding material 7 can be located in the clearance 31. If the bonding material 7 is solder, the solder is melted by local heating with hot air or laser during bonding. Advantageously, the liquefied bonding material 7 can be evenly spread over a junction using capillarity.

In other words, the first terminal 1 and the second terminal 4 are separated from each other, improving bonding quality and workability. A distance of at least 10 µm allows the bonding of the terminals. A thickness of about 100 µm is desirable in view of the reliability of bonding.

Subsequently, in the step of FIG. 2(D), a control board 8 provided beforehand with through holes is inserted onto the third terminals 5 and is electrically connected to the third terminals 5. At this point, the third terminals 5 and the control board 8 can be joined with solder. Typically, Sn—Ag—Cu solder for mounting is applicable. In the step of FIG. 2(B), the bottoms of the packages 6 can be substantially set at the same height and thus the mounting surface of the control board 8 can be mounted substantially at the same height.

Thus, according to the embodiment of the present invention, the bottoms of the case 2 and the packages 6 are set at the same height using the same plane, thereby equalizing reaction forces applied to the bottoms of the packages 6 attached to the heat sink. This suppresses a stress applied to the junctions of the control board 8 and the third terminals 5 extended out of the packages 6, achieving higher reliability.

Furthermore, heat sink grease can have an even thickness in the packages 6. This obtains equal thermal resistance and suppresses thermal destruction caused by variations in the thickness of the heat sink grease in the semiconductor device.

Moreover, it is assumed that the at least two packages 6 are assembled into the case 2 according to the embodiment of the present invention. This point will be explained below in a supplemental manner.

Figure 3:
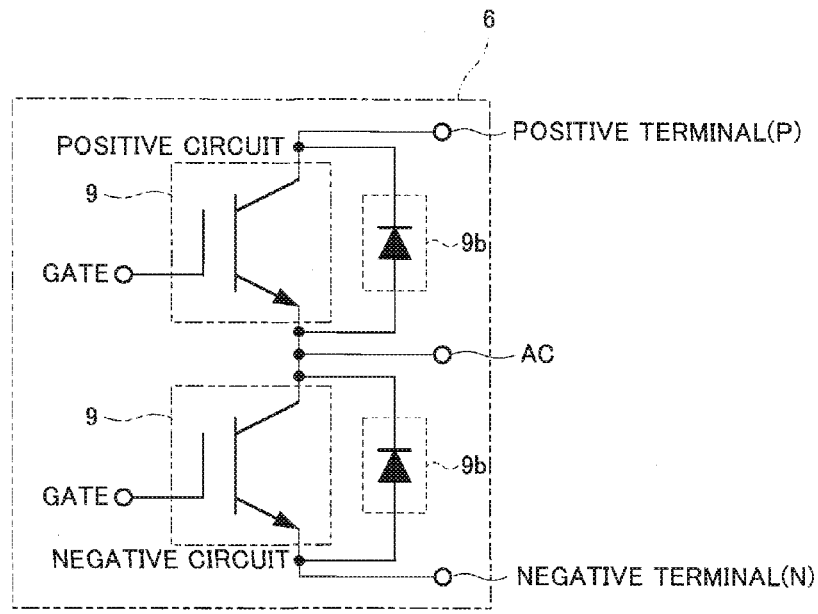
FIG. 3 is a circuit diagram showing a package according to the first embodiment.

FIG. 3 is a circuit diagram in the package 6. The internal structure of the package 6 is not limited to that of FIG. 3.

Figure 4:
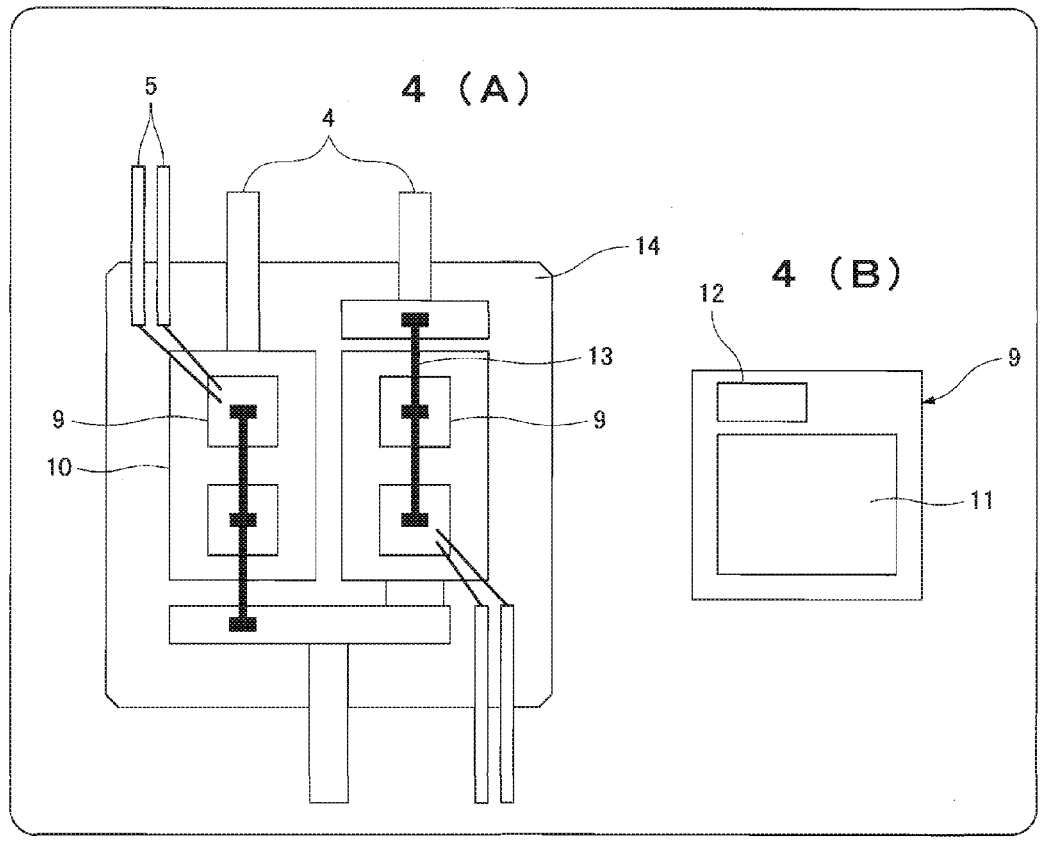
FIG. 4(A) shows a schematic diagram of the internal structure of the package according to the first embodiment.
FIG. 4(B) shows a plan view of a power semiconductor element according to the first embodiment.

FIGS. 4(A) and 4(B) are schematic diagrams showing the internal planar structure of the package 6 according to the embodiment of the present invention.

As shown in FIG. 3, the package 6 includes two power semiconductor elements 9 connected in series. The package 6 is a one phase inverter having a positive terminal, a negative terminal, and an output terminal. As shown in FIG. 4(A), the power semiconductor elements 9 are mounted at two locations on a lead frame 10. One of the power semiconductor elements 9 acts as a positive circuit while the other acts as a negative circuit. Moreover, gates for turning on or off the circuits are provided. For example, the three packages 6 configured thus can be combined to form an inverter circuit for a three-phase alternating current. This circuit controls the rotations of a motor. Thus, this configuration is a unit of power modules for power conversion. The at least two packages 6 are combined to act as a module.

As shown in FIG. 4(A), the power semiconductor elements 9 are mounted on the lead frame 10. The power semiconductor elements 9 are, for example, IGBTs. In this case, diodes 9b are mounted at the same time. The power semiconductor elements 9 are joined to the lead frame 10 with a bonding material (not shown). The bonding material is desirably a metallic material having high thermal conductivity, e.g., Sn—Ag—Cu solder in view of heat dissipation.

As shown in FIG. 4(B), the power semiconductor element 9 has a source electrode 11 and a gate electrode 12 on the surface of the power semiconductor element 9. Moreover, the power semiconductor element 9 is connected to the terminal of the lead frame 10 via an Al wire 13. In this case, the drain electrode of the power semiconductor element 9 corresponds to the back side of the element. Since a large current of several amperes to several hundred amperes is applied to the source electrode 12, the multiple Al wires 13 need to be joined without melting. The Al wire 13 does not need to be shaped like a wire and may be a foil-like Al ribbon.

The gate electrode 12 is fed with only a smaller control current than the source electrode 11 and thus requires a small electrode area. The Al wire 13 only needs a smaller diameter than the source electrode 11. For example, the Al wire 13 can be 150 um in diameter. This configuration is molded with mold resin 14 except for the second terminals 4 and the third terminals 5 that are drawn to the outside. The mold resin 14 may be, for example, thermosetting epoxy resin for transfer molding.

FIG. 5 is a cross-sectional view of the package 6.

A heat sink 16 is disposed on the underside of the lead frame 10 with an insulating layer 15 interposed between the lead frame 10 and the heat sink 16. Heat generated from the power semiconductor element 9 is released to the outside through the heat sink 16. A circuit containing the power semiconductor element 9 generates a voltage of up to several hundred V to a voltage higher than 1000 V. The heat sink 16 and the lead frame 10 need to be electrically insulated from each other for safety and thus the insulating layer 15 is used as an intermediate layer. The insulating layer 15 is desirably made of resin with heat dissipation and insulation. A highly thermally conductive filler, e.g., alumina or boron nitride may be used to improve heat dissipation.

This configuration reduces variations in thermal resistance among the packages 6 without applying an excessive stress to the connecting portions of the control board 8 and the packages 6, thereby effectively improving the reliability of the semiconductor device.

According to the first embodiment, the control board 8 is attached to the third terminals 5 in the step of FIG. 2(D). Alternatively, the semiconductor device can be manufactured such that the packages 6 with the control board 8 attached to the third terminals 5 are disposed on the working table 3 in the step of placing the packages 6 on the working table 3 in FIG. 2(B).

(Second Embodiment)

FIGS. 6 and 7(A) to 7(D) show a second embodiment of the present invention.

In the first embodiment, the second terminal 4 of the package 6 is connected to the top surface of the first terminal 1 with the bonding material 7 near the case 2, whereas the semiconductor device of the second embodiment is different from the first embodiment in that a second terminal 4 is connected to the undersurface of a first terminal 1 with a bonding material 7 near a case 2. Other configurations are identical to those of the first embodiment.

As shown in FIG. 6, the case 2 of the second embodiment has a partition wall 32 that is formed at an intermediate point in the depth direction in the case. An opening 33 is formed at the center of the partition wall 32. One end of the first terminal 1 is exposed on the underside of the partition wall 32 of the case 2. The second terminal 4 is located closer to the mounting surface of a heat sink than the first terminal 1, that is, below the first terminal 1.

FIGS. 7(A) to 7(D) show a manufacturing process.

Figure 7:
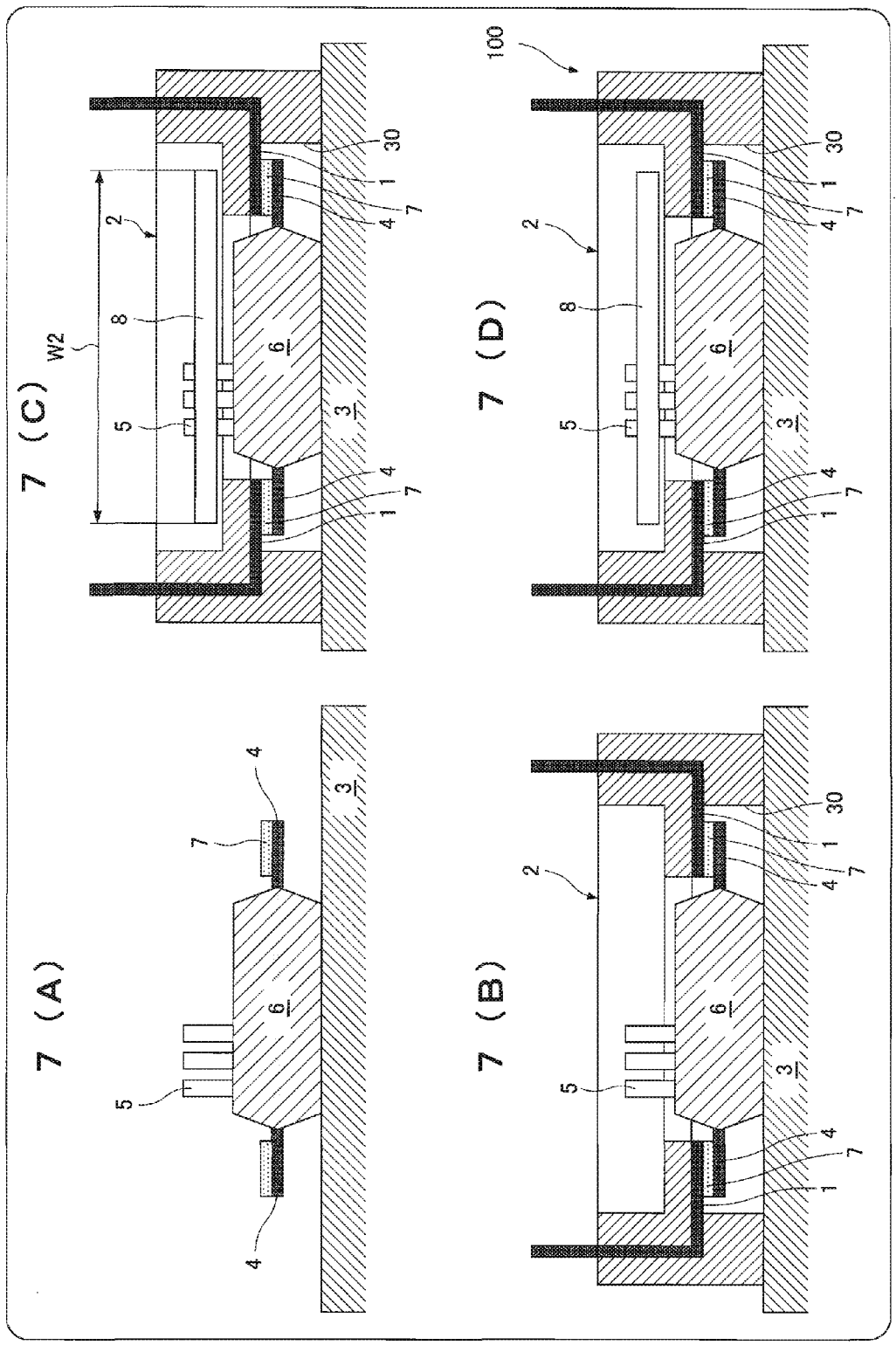
FIG. 7(A) shows a manufacturing process drawing of the semiconductor device according to the second embodiment.
FIG. 7(B) shows a manufacturing process drawing of the semiconductor device according to the second embodiment.
FIG. 7(C) shows a manufacturing process drawing of the semiconductor device according to the second embodiment.
FIG. 7(D) shows a manufacturing process drawing of the semiconductor device according to the second embodiment.

First, as shown in FIG. 7(A), packages 6 are placed on a working table 3; meanwhile, the bonding material 7, e.g., solder paste is applied to the top surfaces of the second terminals 4.

Subsequently, as shown in FIG. 7(B), the case 2 is placed on the working table 3 so as to be located on the packages 6. Thus, the first terminals 1 of the case 2 come into contact with the second terminals 4 of the packages 6 via the bonding material 7.

In FIG. 7(C), a control board 8 provided beforehand with through holes is inserted onto third terminals 5 of the packages 6 and is electrically connected to the third terminals 5. At this point, the third terminals 5 and the control board 8 can be joined to each other with solder. Typically, Sn—Ag—Cu solder for mounting is applicable.

In FIG. 7(D), the first terminals 1 and the second terminals 4 are joined to each other with solder via the bonding material 7 by heating and cooling, completing a semiconductor device 100.

Thus, in the step of FIG. 7(B), the bottoms of the case 2 and the packages 6 can be aligned with each other; meanwhile, the bottoms of the packages 6 can be aligned substantially at the same height, thereby mounting the mounting surface of the control board 8 substantially at the same height. This can reduce variations in thermal resistance among the packages 6 without applying an excessive stress to the connecting portions of the control board 8 and the packages 6, effectively improving the reliability of the semiconductor device.

According to the second embodiment, in the step of FIG. 7(C), the control board 8 is attached to the third terminals 5. If a width W2 of the control board 8 is smaller than a width W1 of the opening 33 formed on the partition wall 32 of the case 2, the semiconductor device can be manufactured such that the packages 6 with the control board 8 attached to the third terminals 5 are placed on the working table 3 in the step of FIG. 7(A).

(Third Embodiment)

FIGS. 8 and 9(A) to 9(C) show a third embodiment of the present invention.

In the first and second embodiments, the clearance 31 is formed between the first terminal 1 and the second terminal 4 such that the first terminal 1 extended in parallel with the bottom of the case 2 and the second terminal 4 extended in parallel with the bottom of the package 6 do not come into contact with each other in the process of manufacture, whereas in the third embodiment, first terminals 1 and second terminals 4 are oriented in a direction orthogonal to the bottoms of the terminals, thereby aligning the bottoms of a case 2 and packages 6 even if the first terminals 1 and the second terminals 4 are in direct contact with each other. Other configurations are identical to those of the first and second embodiments.

Figure 8:
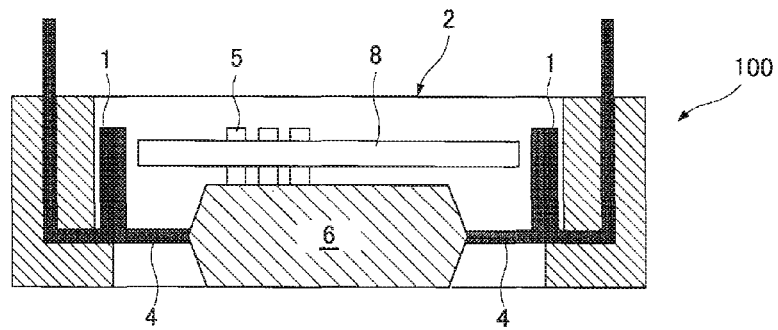
FIG. 8 is a cross-sectional view showing a semiconductor device according to a third embodiment of the present invention.

As shown in FIG. 8, one end of the first terminal 1 is exposed in the case 2 and is bent upward along the depth direction of the case 2. The other end of the first terminal 1 is drawn to the outside through the case 2. The end of the second terminal 4 horizontally drawn from the package 6 is bent upward along the depth direction of the case 2 and is in contact with the plane of the first terminal 1. For example, the first terminal 1 and the second terminal 4 in contact with each other are directly caulked or are electrically connected to each other via ultrasonic bonding.

A control board 8 provided beforehand with through holes is inserted onto third terminals 5 that are drawn from the packages 6 and are bent upward in the depth direction of the case 2, and then the control board 8 is joined to the third terminals 5 with solder.

Figure 9:
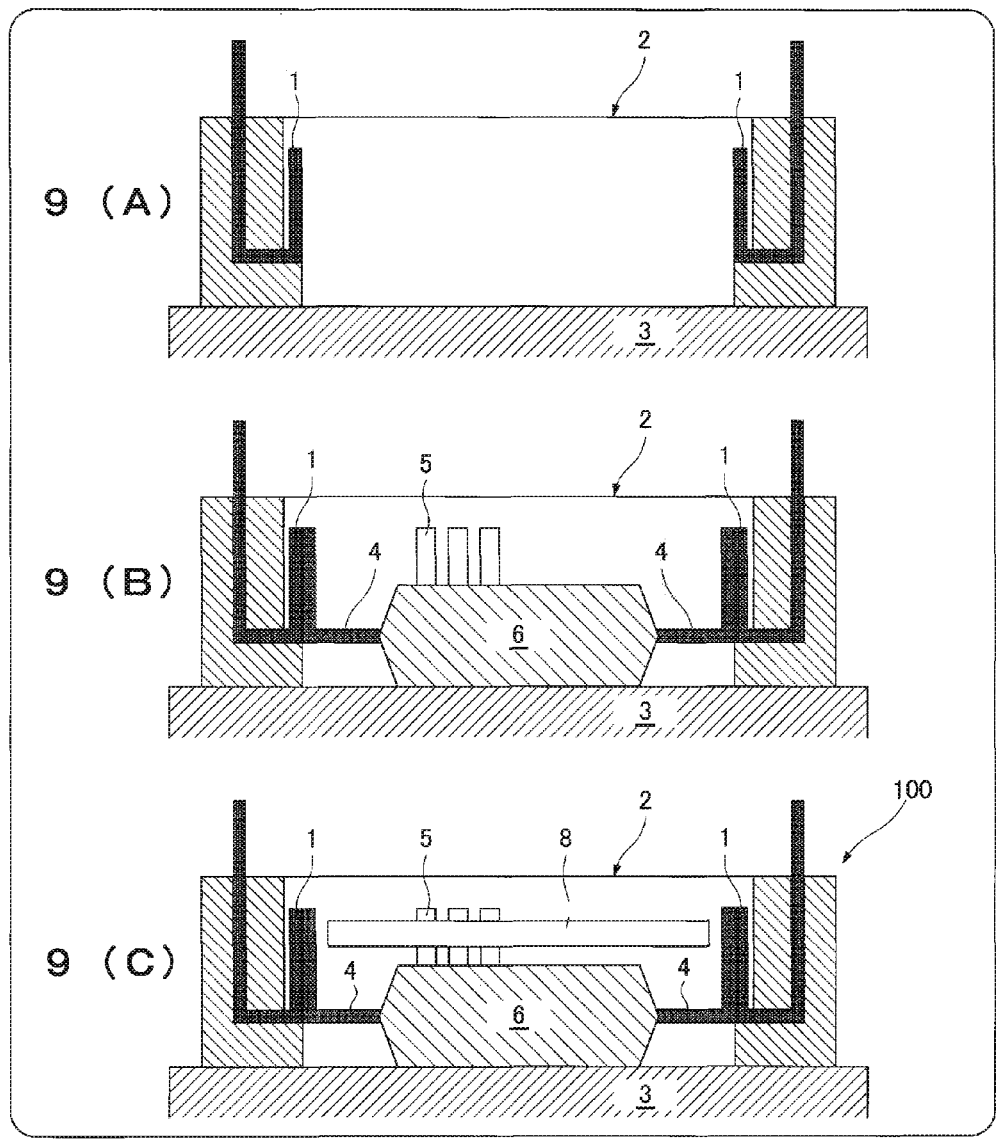
FIG. 9(A) shows a manufacturing process drawing of the semiconductor device according to the third embodiment.
FIG. 9(B) shows a manufacturing process drawing of the semiconductor device according to the third embodiment.
FIG. 9(C) shows a manufacturing process drawing of the semiconductor device according to the third embodiment.

FIGS. 9(A) to 9(C) show a manufacturing process.

First, as shown in FIG. 9(A), the case 2 is placed on a working table 3.

Subsequently, as shown in FIG. 9(B), the packages 6 are placed on the working table 3 in the case 2. For example, the first terminal 1 and the second terminal 4 in surface contact with each other are directly caulked or are electrically connected to each other via ultrasonic bonding.

The first terminals 1, the second terminals 4, and the third terminals 5 are all drawn in the same direction. In other words, these terminals are disposed perpendicularly to the bottom of the case 2 and the back sides of the packages 6.

In FIG. 9(C), the control board 8 is inserted onto the third terminals 5 and is joined to the third terminals 5 with solder.

According to this structure, the first terminal 1 and the second terminal 4 do not need to be separated from each other unlike in the first and second embodiments. Specifically, in the first and second embodiments, the first terminal 1 and the second terminal 4 that are extended in parallel with the bottoms of the case 2 and the package 6 are separated from each other without coming into contact with each other in order to align the bottoms of the case 2 and the packages 6, whereas in the third embodiment, the terminals are oriented perpendicularly to the bottoms of the case 2 and the packages 6, thereby aligning the bottoms of the case 2 and the packages 6 even if the first terminals 1 and the second terminals 4 are in contact with each other.

The packages 6 are placed into the case 2. A semiconductor device can be also manufactured by first placing the packages 6 on the working table 3 and then putting the case 2 onto the packages 6.

In the third embodiment, the first terminals 1 are drawn to the top of the case 2 while the second terminals 4 of the packages 6 are also bent to the top of the case 2 along the first terminals 1. The semiconductor device can be also manufactured by drawing the first terminals 1 to the bottom of the case 2 and bending the second terminals 4 of the packages 6 to the bottom of the case 2 along the first terminals 1. As shown in FIG. 8, if the first terminals 1 and the second terminals 4 are bent to the top of the case 2, the first terminal 1 and the second terminal 4 are caulked or joined to each other via ultrasonic bonding with higher workability.

The first to third embodiments can be implemented at the same time as long as contradictions are not particularly found. Also in this case, the case and the packages are placed using the same plane of the working table. Thus, the bottoms of the packages mounted in the case are aligned at the same height so as to suppress an excessive stress applied to the control board 8, and heat sink grease used in attachment to a heat sink has an even thickness among the packages so as to suppress variations in thermal resistance.

INDUSTRIAL APPLICABILITY

The present invention contributes to the improvement of the performance of a semiconductor device used for power conversion of inverters and so on.

REFERENCE SIGNS LIST

1 first terminal
2 case
3 working table
4 second terminal
5 third terminal
6 package
7 bonding material
8 control board
9 power semiconductor element
10 lead frame
11 source electrode
12 gate electrode
13 Al wire
14 mold resin
15 insulating layer
16 heat sink
17 positive terminal
18 negative terminal
19 output terminal
20 tapped hole
30 opening at the bottom of the case
31 clearance between the first terminal of the case and the second terminal of the package
32 partition wall formed at intermediate point in the depth direction in the case
33 opening at the center of the partition wall

The invention claimed is:

1. A method for manufacturing a semiconductor device including a plurality of packages disposed in a resin-molded case, the package containing a power semiconductor element,
    the method comprising:
    placing a bottom of the case on a working table with an opening formed at the bottom, the case including a first terminal with one end internally drawn along the bottom of the case for connecting to the power semiconductor element;
    placing the package on the working table through the opening of the case, the package including a second terminal connected to the power semiconductor element, disposing a first faying surface that is a top surface of the first terminal of the case and a second faying surface that is an undersurface of the second terminal of the package in such a manner that the first faying surface and the second faying surface are opposed to each other, and forming a clearance between the first faying surface and the second faying surface; and
    electrically connecting the first terminal and the second terminal with a bonding material disposed in the clearance.

2. The method for manufacturing a semiconductor device according to claim 1, wherein the first terminal and the second terminal are joined to each other by heating and melting Sn solder used as a bonding material.

3. The method for manufacturing a semiconductor device according to claim 1, wherein the second terminal is plated with Sn used as a principal component.

4. The method for manufacturing a semiconductor device according to claim 1, wherein the package includes a third terminal drawn in a direction that separates from the working table along the depth direction of the case, and a control board including a circuit configured to output a driving signal to the power semiconductor element is electrically connected to the third terminal before or after the package is placed on the working table.

5. The method for manufacturing a semiconductor device according to claim 1, wherein one of the first terminal and the second terminal is composed of one of Cu and a Cu alloy.

* * * * *